(12) United States Patent
Jan

(10) Patent No.: US 8,901,693 B2
(45) Date of Patent: Dec. 2, 2014

(54) SUBSTRATE INSIDE TYPE MODULE STRUCTURE

(75) Inventor: Shin-Dar Jan, Hsinchu (TW)

(73) Assignee: Lite-On Technology Corporation, Taipei (TW)

( * ) Notice: Subject to any disclaimer, the term of this patent is extended or adjusted under 35 U.S.C. 154(b) by 50 days.

(21) Appl. No.: 13/566,154

(22) Filed: Aug. 3, 2012

(65) Prior Publication Data
US 2014/0035081 A1 Feb. 6, 2014

(51) Int. Cl.
*H01L 31/0232* (2014.01)
*H01L 21/00* (2006.01)

(52) U.S. Cl.
USPC ............................................. 257/432; 438/48

(58) Field of Classification Search
USPC .................... 257/431, 432, 680, 700
See application file for complete search history.

(56) References Cited

U.S. PATENT DOCUMENTS

| 2005/0099531 A1* | 5/2005 | Wu et al. ................ 348/374 |
| 2007/0096280 A1* | 5/2007 | Tu et al. ................ 257/680 |
| 2008/0246868 A1* | 10/2008 | Abe ................ 348/308 |

* cited by examiner

*Primary Examiner* — Chuong A Luu
*Assistant Examiner* — Moin Rahman
(74) *Attorney, Agent, or Firm* — Li & Cai Intellectual Property (USA) Office (57) ABSTRACT

The present invention provides a module structure of substrate inside type comprising a first substrate with a concave structure. A chip is configured on the concave structure of the first substrate, with a first contact pad and a sensing area. A second substrate is disposed on the first substrate, with at least one through hole structure and a second contact pad. The first contact is coupled to the second contact pad via a wire. The second substrate includes a first portion embedded into the module structure, and a second portion extended to outside of the module structure. A lens holder is disposed on the second substrate, and a lens is located on the top of the lens holder. A transparent material is disposed within the lens holder or the second substrate. The lens is substantially aligning to the transparent material and the sensing area.

5 Claims, 9 Drawing Sheets

SUBSTRATE INSIDE TYPE MODULE STRUCTURE

TECHNICAL FIELD

The present invention generally relates to semiconductor device module structure, more particularly, to a substrate inside type module structure by integrating a substrate, a lens holder and an image sensor to reduce the device size.

BACKGROUND

In the field of semiconductor devices, the device density is increased and the device dimension is reduced, continuously. Conventionally, in the flip-chip attachment method, an array of solder bumps is formed on the surface of the die. The formation of the solder bumps may be carried out by using a solder composite material through a solder mask for producing a desired pattern of solder bumps. The function of chip package includes power distribution, signal distribution, heat dissipation, protection and support . . . and so on. As a semiconductor chip become more complicated, the traditional package technique, for example lead frame package, flex package, rigid package technique, can't meet the demand of producing smaller chip with high density elements on the chip. Wafer level package (WLP) technique is an advanced packaging technology, by which the dice are manufactured and tested on the wafer, and then the wafer is singulated by dicing for assembly in a surface-mount line. Because the wafer level package technique utilizes the whole wafer as one object, not utilizing a single chip or die, and therefore, before performing a scribing process, packaging and testing has been accomplished. Furthermore, WLP is such an advanced technique so that the process of wire bonding, die mount and under-fill can be omitted. By utilizing WLP technique, the cost and manufacturing time can be reduced, and the resulting structure of WLP can be equal to the die; therefore, this technique can meet the demands of miniaturization of electronic devices.

Currently, the flip chip technology used for the camera module is performed as a stud bump process on the entire wafer by a wire bonding equipment, whereby solder balls to being replaced by the stud bumps.

A CMOS image sensor is manufactured into a CMOS image sensor module from a CMOS image sensor chip by an electronic package technology. And it is applied into various goods and a package specification required by the CMOS image sensor module depends on characteristics of the finished goods. Especially, the recent tendencies of a CMOS image sensor module, namely, high electricity capabilities, miniaturization/high density, a low power consumption, multifunction, a high speed signal processing, a reliability are the representative characteristics of a miniaturization of the electronic goods.

Contrary to general CMOS chips, the CMOS image sensor in the past is feasible to a physical environment and can be polluted by the impurities, and a leadless chip carrier LCC type package is used when its size is not considered to be important. However, in a recent tendency of a market requiring for thin and simplified characteristics such as in a camera phone, smart phone, chip-on-board (COB), chip-on-film (COF), chip size package (CSP), etc. are generally used.

Current flip chip structure can reduce module height but flip chip machine is very expensive and low UPH (Unit Per Hour). So, the investment is very huge. And, yield is lower and not easy to be controlled.

Therefore, based-on the shortcomings of prior arts, the present invention provide a newly substrate inside type module structure, which has no need for new investment and the process yield will be better.

SUMMARY OF THE INVENTION

Based-on the shortcomings of the above-mentioned, an objective of the present invention is to provide a substrate inside type module structure with a smaller height of the module structure.

Another objective of the present invention is to provide a substrate inside type module structure by integrating a substrate, a lens holder and an image sensor to reduce the device size, and enhancing yield and reliability.

Yet another objective of the present invention is to provide a substrate inside type module structure with good thermal performance, lower cost and easy to manufacture.

According to an aspect of the present invention, the present invention provides a substrate inside type module structure. The module structure comprises a first substrate with a concave structure. A chip is configured on the first substrate within the concave structure, with a first contact pad and a sensing area. A second substrate is disposed on the first substrate, with at least one through hole structure and a second contact pad. The first contact is coupled to the second contact pad via a wire. The second substrate includes a first portion embedded into the module structure and a second portion extending to outside of the module structure, wherein the at least one through hole structure and the second contact pad are formed in the first portion. A transparent material is disposed within the lens holder or on the second substrate. A lens holder is disposed on the second substrate, and a lens is located on the top of the lens holder, substantially aligning to the transparent material and the sensing area.

The first substrate is adhered to the second substrate via a conductive layer or an adhesion layer for electrically connecting with each other, or without electrically connecting. The second substrate is a printed circuit board or a flexible printed circuit board, with a trace formed thereon, respectively. The chip is adhered to the first substrate via a first adhesion layer, and the lens holder is adhered to the second substrate via a second adhesion layer.

In another example, a first contact pad is formed on the first substrate; a top surface of the second substrate includes two regions with different step height, wherein the second contact pad is formed on a top surface of relative low region.

In yet another example, the module structure further comprises a passivation layer formed on the chip and the first substrate, wherein the passivation layer is fully-covering, partially-covering or non-covering over the wire.

According to another aspect of the present invention, the present invention provides a substrate inside type module structure. The module structure comprises a chip, with a first contact pad and a sensing area. A substrate is disposed on the chip, with a first through hole structure, a second through hole structure and a second contact pad, wherein the first contact pad is electrically connected to the second contact pad via a wire, wherein the substrate includes a first portion embedded into the module structure and a second portion extending to outside of the module structure, wherein the first and the second through hole structure and the second contact pad are formed in the first portion. A lens holder is disposed on the substrate, and a lens located on the lens holder, substantially aligning to the sensing area.

In an example, substrate includes a first substrate and a second substrate, wherein the first substrate is embedded into the module structure, and a third portion of the second substrate locates within the module structure and a fourth portion of the second substrate extends to outside of the module structure, wherein the first substrate is adhered to the third portion of the second substrate.

The module structure further comprises an adhesion layer formed on a backside of the chip and on a lower surface of the substrate, and a material layer configured on the adhesion layer.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

The present invention provides a substrate inside type module structure which can be manufactured by employing a chip-on-board (COB) packaging technique. The chip-on-board (COB) packaging technique is used for the integrated circuit packaging, which the chip is adhered on the circuit board or substrate, and thereby effectively performing chip packaging and testing based-on the circuit board assembly.

Figure 1:
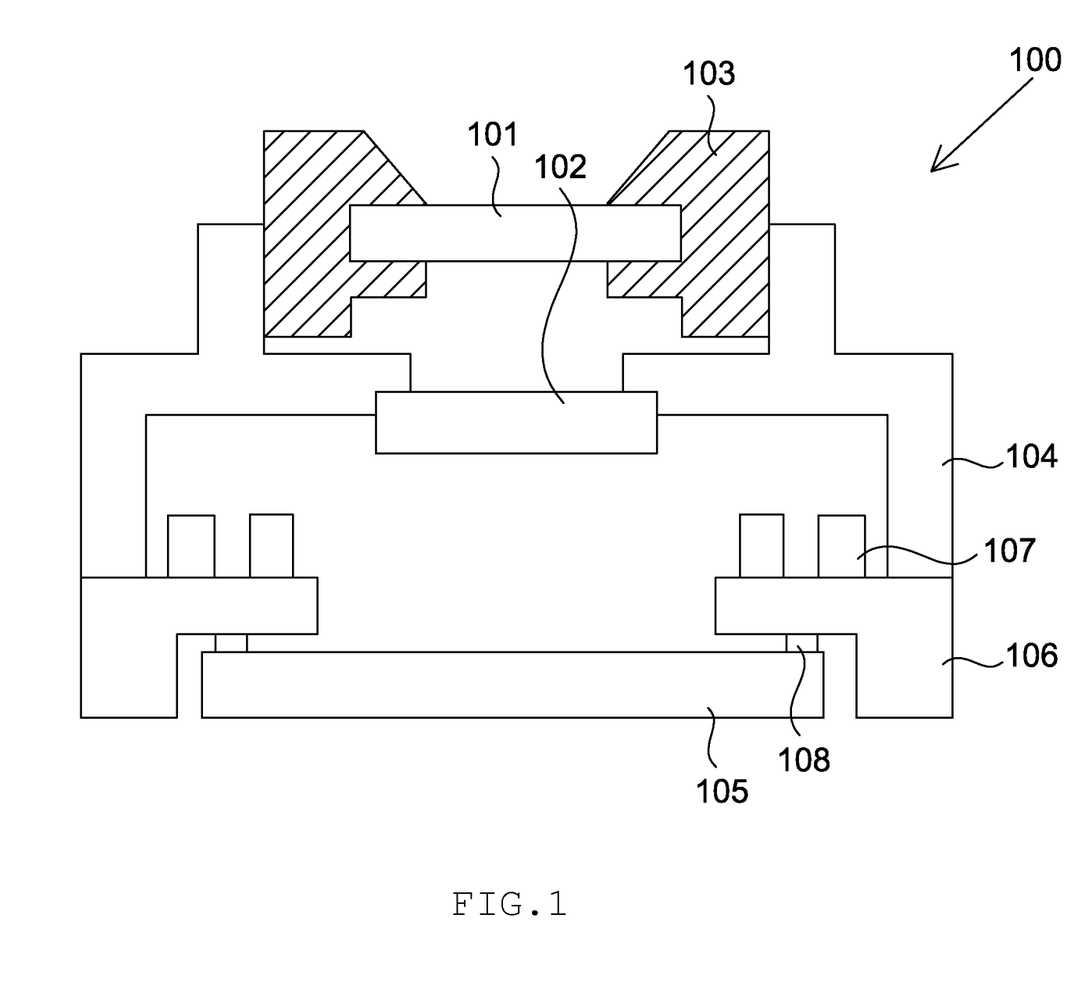
FIG. 1 illustrates a sectional view of a flip chip package structure.

FIG. 1 shows a sectional view of a flip chip package structure. As shown in FIG. 1, the flip chip package structure 100 comprises a substrate 106, a chip 105, a passive component 107, a lens holder 104, a lens 101 and a transparent plate (material) 102. The substrate 106 has a concave structure formed therein for receiving the chip 105 and a conductive layer 108. The chip 105 and the conductive layer 108 are formed under the substrate 106, wherein the conductive layer 108 is electrically connected to the substrate 106 and a contact pad of the chip 105. The lens holder 104 includes a jig 103 for fixing the lens 101. At least one passive component 107 is formed (adhered) on the substrate 106 within the lens holder 104. The lens 101 is disposed on the upper portion of the lens holder 104. Moreover, the transparent plate 102 is optionally disposed within the lens holder 104, between the lens 101 and the chip 105. The lens holder 104 is adhered to the substrate 106 via an adhesion layer.

Figure 2:
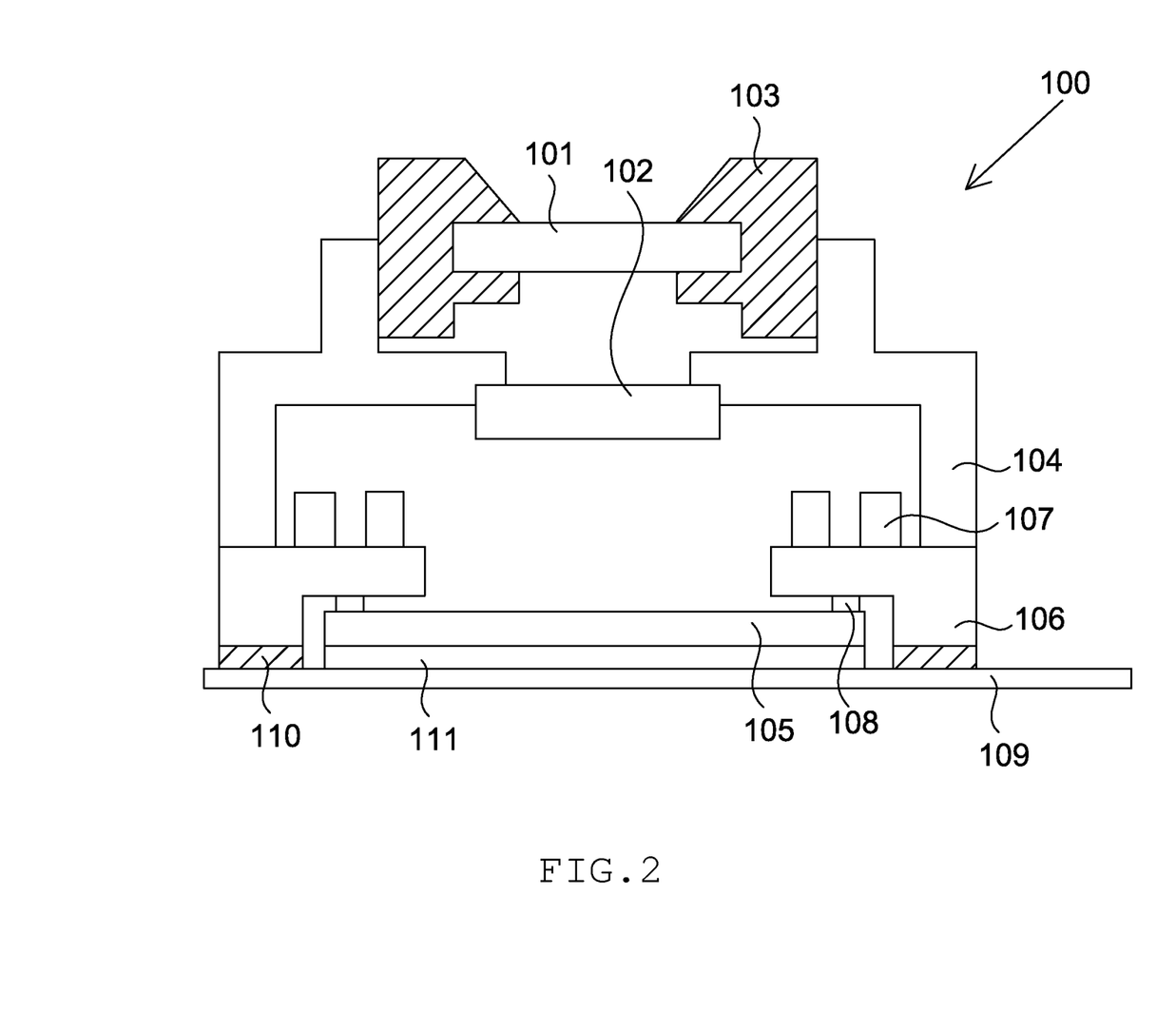
FIG. 2 illustrates a sectional view of another example of a flip chip package structure.

FIG. 2 shows a sectional view of another example of a flip chip package structure. As shown in FIG. 2, the substrate 106 is adhered to the printed circuit board 109 via the conductive layer 110 for electrically connecting to each other. The heat dissipation layer 111 is formed between the chip 105 and the printed circuit board 109 for facilitating heat dissipation.

Figure 3:
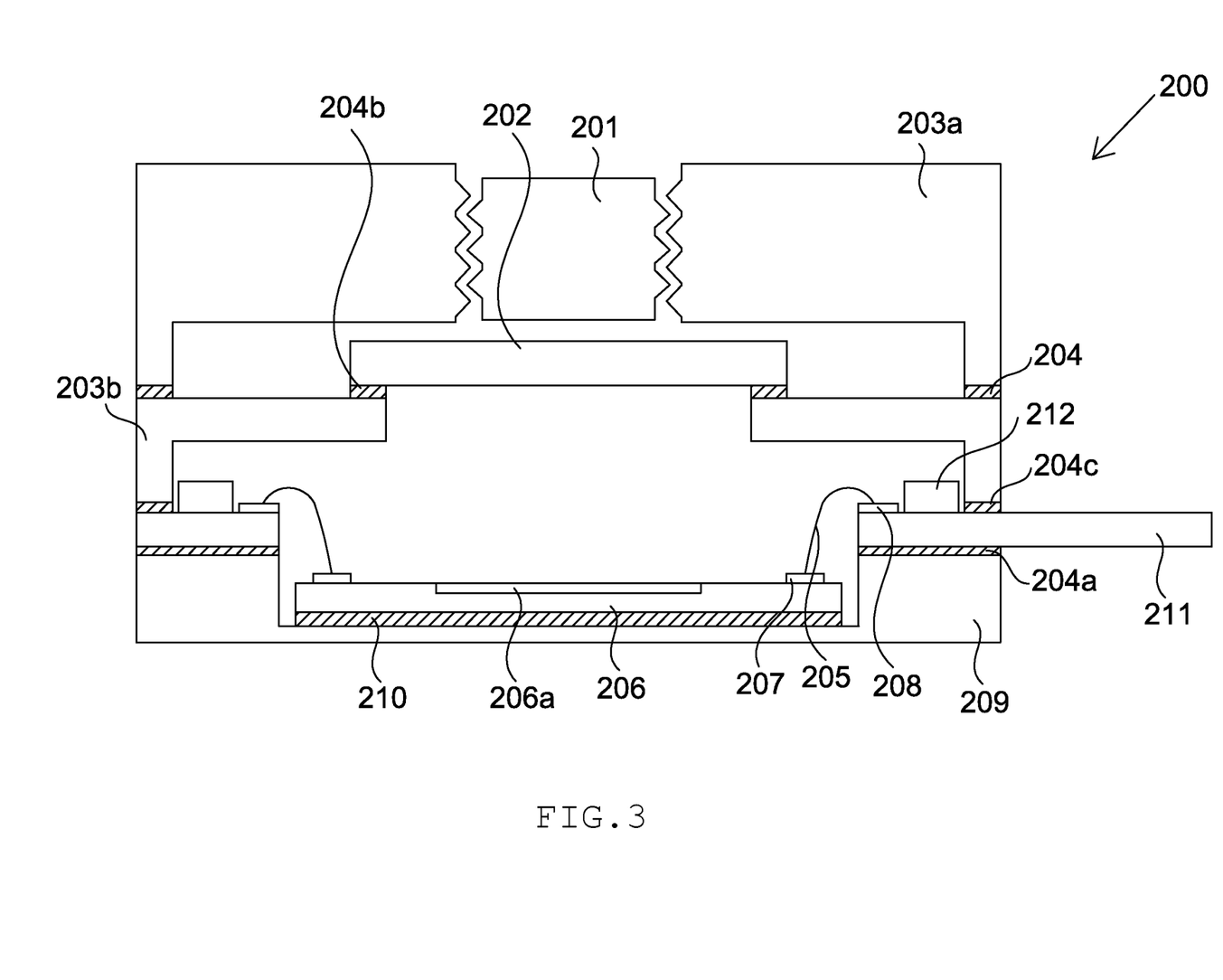
FIG. 3 illustrates a sectional view of a substrate inside type module structure according to the present invention.

FIG. 3 shows a sectional view of a substrate inside type module structure by integrating a lens holder and an image sensor chip according to the present invention. As shown in FIG. 3, the substrate inside type module structure 200 integrates the lens holder and the image sensor chip to be as a module structure with sensing function, which can be applied to a camera module of a mobile phone or other portable devices. The substrate inside type module structure 200 comprises a substrate 209 and a substrate 211, a chip 206, an upper portion/lower portion of a lens holder 203a/203b, a lens 201 and a transparent plate (material) 202. The substrate 211 is partially embedded in (into) the module structure, wherein the contact pad 208 and at least one electronic component 212 formed on the substrate 211 within the module structure. In other words, the substrate 211 is located in the inner or middle layer of the module structure, and the substrate 209 is located in the bottom of the module structure. The electronic component 212 is for example an active component or a passive component, wherein active component is a semiconductor integrated circuit (IC), and the passive component includes a capacitor or an inductor.

In the module structure, a conductive layer or an adhesion layer 204a is formed on the substrate 209 or the substrate 211, wherein the substrate 209 is adhered to the substrate 211 via the conductive layer or the adhesion layer 204a. A trace of the substrate 209 may be electrically connected to a trace of the substrate 211 via the conductive layer 204a. In one embodiment, material of the conductive layer 204a includes a conductive paste or a conductive film, which may be formed as a pattern paste on the substrate by employing a printing or coating process. The conductive layer 210a may be optically coated on the substrate 211 or the substrate 209. For example, the substrate 209 is a non-wired substrate adhered to the substrate 211 via the conductive layer or the adhesion layer 204a.

In one embodiment, the substrate 211 is partially embedded in (into) the module structure, the substrate 211 embedded into the module structure has a through hole structure formed therein, and the contact pad 208 and at least one electronic element 212 configured on the substrate 211 within the module structure. Another part of the substrate 211 extends to outside of the module structure, having a wire for electrically connected to other device. The substrate 209 has a concave structure formed therein for receiving or accommodating the chip 206 disposed into the concave structure. In one embodiment, the through hole structure of the substrate 211 locates above the concave structure of the substrate 209, and the size of the through hole structure of the substrate 211 is substantially the same as the concave structure of the substrate 209. The through hole structure and the concave structure are generally located at the middle of the substrate, which size of the substrate is larger than that of the chip 206. For example, the through hole structure is formed within the substrate 211 by employing a punching or drilling process. In this embodiment, based-on the substrate 209 and the substrate 211 with the through hole structure and the concave structure formed therein respectively, it equivalent to open a window area at the substrate 209 and the substrate 211. Moreover, a contact pad 208 is formed on the substrate 211.

Size of the substrate 211 is larger than that of the substrate 209 such that the substrate 211 can extend to outside of the substrate 209 (and the module structure) when the two substrates are combined by adhering. It should be noted that the lens holder 203, the transparent plate 202, the substrate 209, a portion of the substrate 211 and the image sensor chip 206 may be integrated into a cubic module structure. Based-on the substrate 211 extending to outside of the cubic module structure, electrical signals of the module structure 200 can be transmitted to other components outside of the cubic module structure via the trace of the substrate 211. For example, the substrate 211 is a printed circuit board or a flexible printed circuit board.

The chip 206 is formed on the substrate 209. The top surface of the chip 206 is exposed to the through hole structure and the concave structure completely, and the sensing area 206a and the contact pad (I/O pad) 207 are exposed to the window area. An adhesion layer (pattern) 210 is formed on the bottom surface of the substrate 209 within the concave structure, and the chip 206 is adhered to the surface of the substrate 209 via the adhesion layer 210. In an example, the chip 206 may be electrically to a conductive layer on the substrate 209. For example, the chip 206 is an image sensor chip which has a sensing area 206a on its surface and a contact pad 207 formed thereon. The substrate 209 is a printed circuit board or a non-wired concave structure.

A wire 205 is electrically connected to the contact pad 208 of the substrate 211 and the contact pad 207 of the chip 206, which may be performed by a wire bonding process. The contact pad 208 is formed on the wire bonding area of the substrate 211. The wire 205 is passing through the through hole structure for electrically connected to the contact pad 207 and the contact pad 208.

The transparent plate 202 is, for example a glass substrate or the substrate made of a transparent material. The transparent plate 202 is located above the substrate 211 for substantially aligning the sensing area 206a. Based-on the through hole structure and the concave structure, the propagating light passing through the transparent plate 202 can directly reach to the sensing area 206a. Size of the transparent plate 202 may be the same or larger than area of the sensing area 206a. The transparent plate (glass substrate) 202 may be round or square type. Transparent plate (glass substrate) 202 may be optionally coated infrared coating for filtering, such as infrared filter for filtering to a certain band of frequency by passing through the lens 201.

The lower portion 203b of the lens holder is adhered (holder mount) on the substrate 211. The upper portion 203a of the lens holder may be a plastic piece or an actuator. Moreover, the upper portion 203a and the lower portion 203b of the lens holder may be integrated into an integral component. An adhesion layer 204 is formed on the substrate 211, and the lower portion 203b of the lens holder is adhered on the substrate 211 via the adhesion layer 204.

The lens 201 is fixed to the upper portion 203a of the lens holder for supporting the lens 201. Moreover, the lens holder may be fixed to the substrate 211 for supporting the lens 201. The lens 201 may be optionally disposed above the lens holder. The module structure 200 of this embodiment, the transparent plate 202 may be optionally disposed within a concave structure or an accommodated space of the lens holder, and between the lens 201 and the chip 206. In other words, the lens 201 is substantially aligning to the transparent plate 202 and the chip 206, and thereby the propagating light directly reaching to the sensing area 206a.

Figure 4:
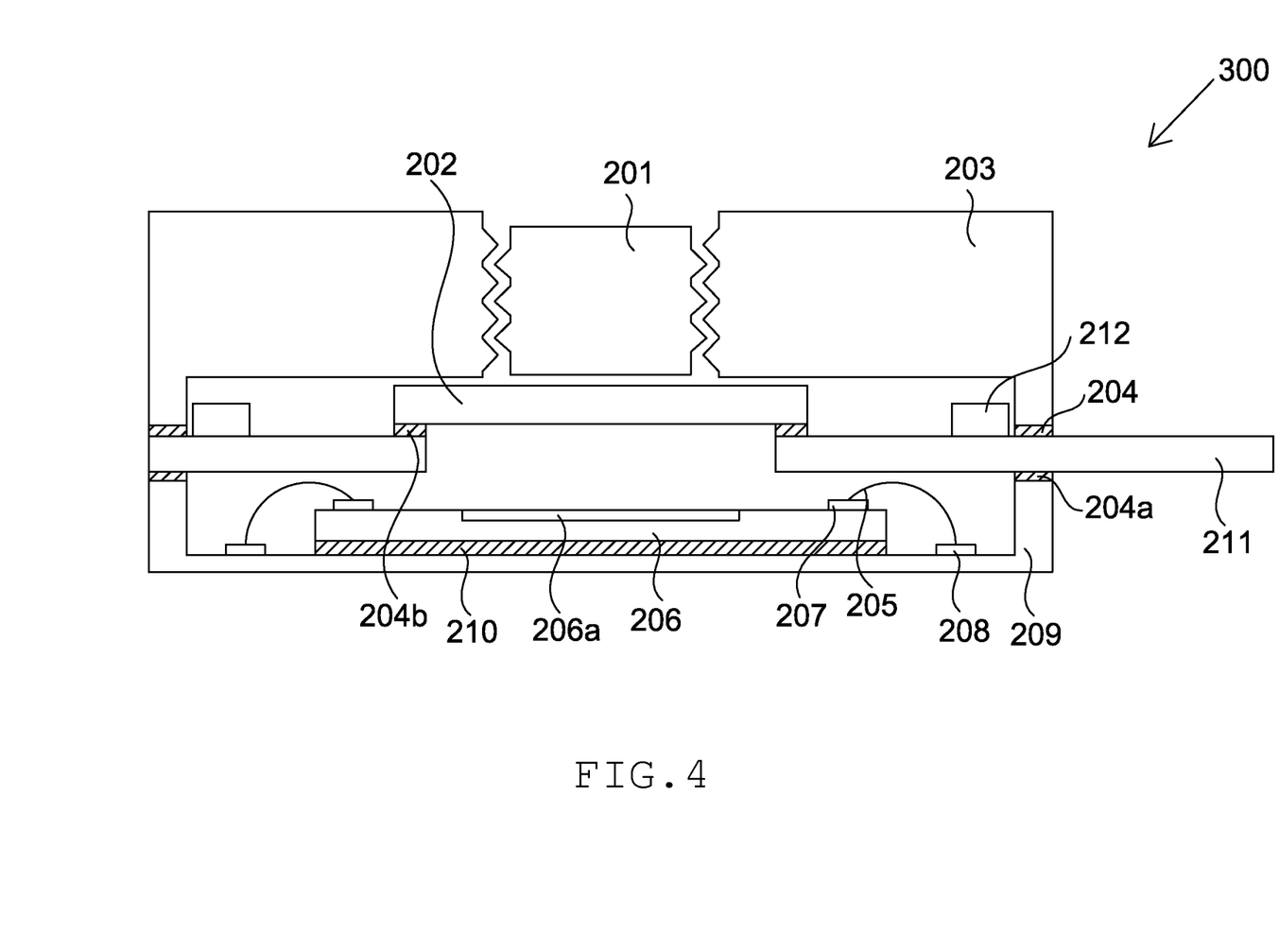
FIG. 4 illustrates a sectional view of a substrate inside type module structure according to an embodiment of the present invention.

As shown in FIG. 4, it shows a sectional view of a substrate inside type module structure according to another embodiment of the present invention. In this embodiment, the substrate 209 has a concave structure formed therein for receiving or accommodating the chip 206 disposed within the concave structure; wherein the contact pad 208 is formed on the surface of the substrate 209 within the concave structure. The adhesion layer 204b is formed on the top surface of the substrate 211 such that the transparent plate 202 is adhered on (to) such top surface region of the substrate 211. Other configuration of the module structure of this embodiment is similar with that of the FIG. 3, and therefore the detailed description is omitted.

In the module structure 300 of this embodiment, the contact pad 208 is formed on the surface of the substrate 209 of the bottom of the module structure within the concave structure, but not formed on the substrate 211 embedded into the module structure. The wire 205 is formed under the substrate 211 for electrically connected to the contact pad 207 and the contact pad 208, without passing through the through hole structure. The transparent plate 202 is configured (disposed) on the substrate 211. The transparent plate 202 is adhered on the substrate 211 via the adhesion layer 204b.

Figure 5:
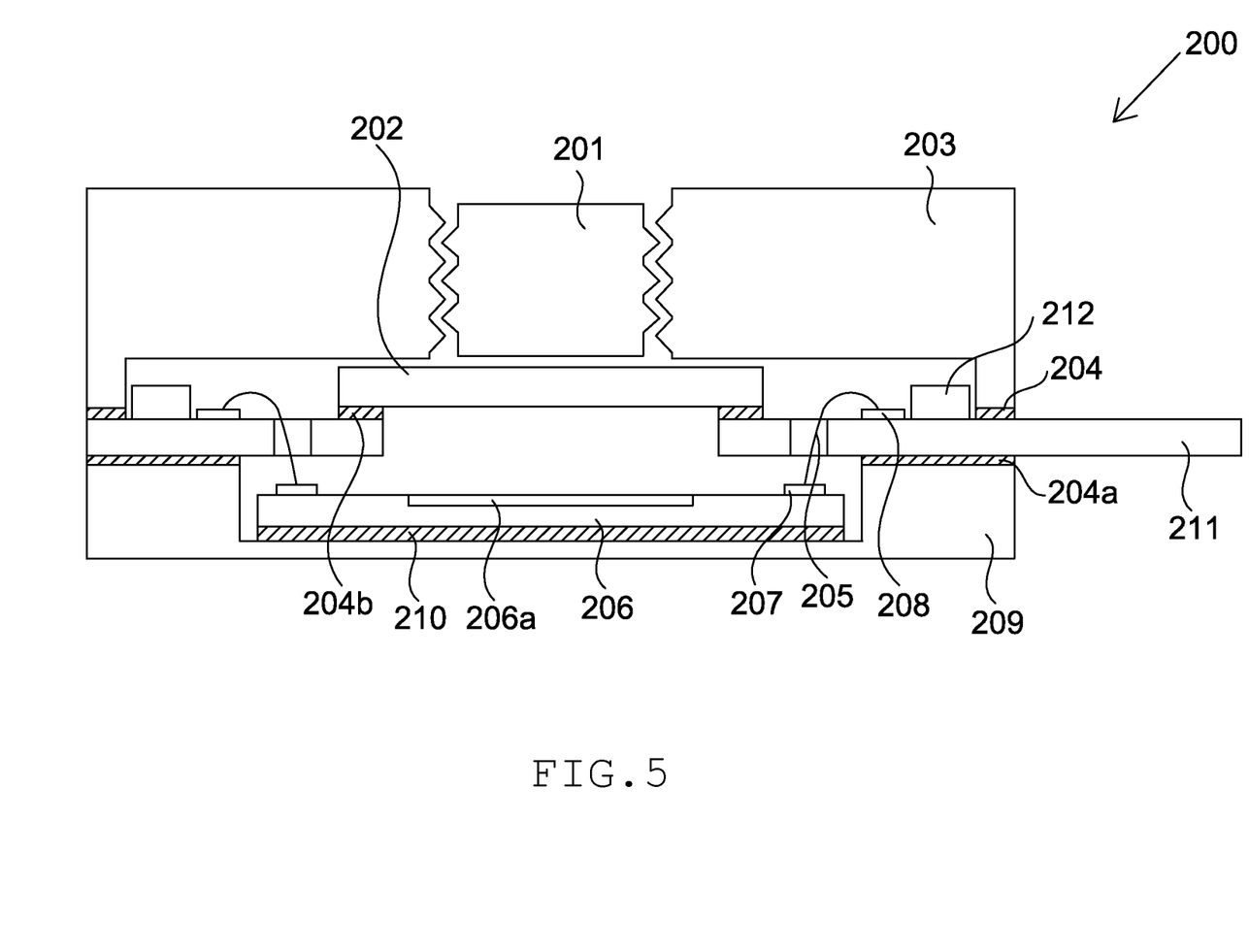
FIG. 5 illustrates a sectional view of a substrate inside type module structure according to another embodiment of the present invention.

As shown in FIG. 5, it shows a sectional view of a substrate inside type module structure according to yet another embodiment of the present invention. In this embodiment, the transparent plate 202 is configured (disposed) on the substrate 211. The transparent plate 202 is adhered on the substrate 211 via the adhesion layer 204b. Moreover, the substrate 211 further comprises another through hole structure such that the wire 205 may pass through such through hole structure for electrically connected to the contact pad 207 and the contact pad 208. Other configuration of the module structure of this embodiment is similar with that of the FIG. 3, and therefore the detailed description is omitted.

Figure 6:
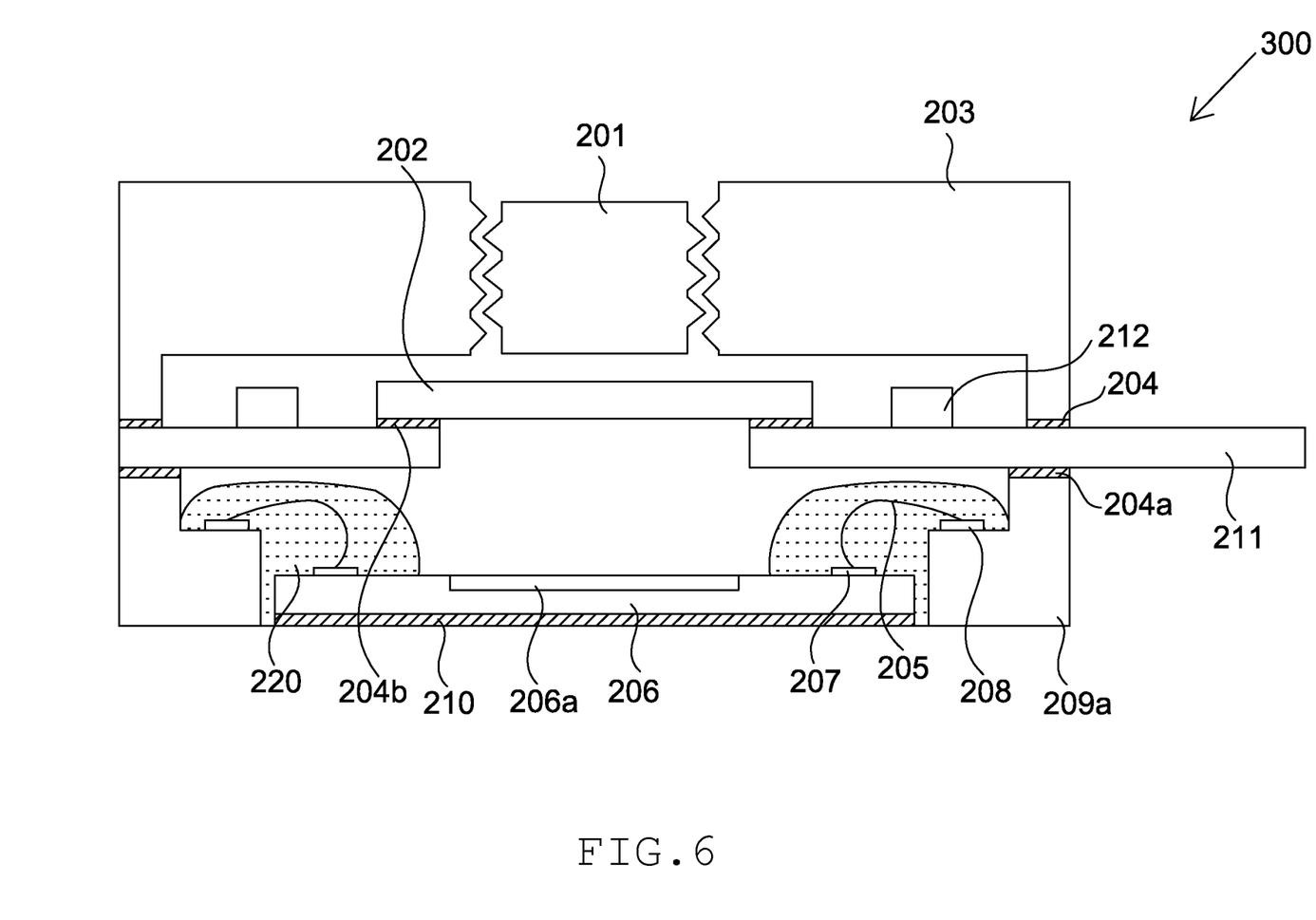
FIG. 6 illustrates a sectional view of a substrate inside type module structure according to yet another embodiment of the present invention.

As shown in FIG. 6, it shows a sectional view of a substrate inside type module structure according to a further embodiment of the present invention. In the module structure 300 of this embodiment, the substrate 209a comprises a through hole structure or a concave structure for receiving the chip 206, and two top surface regions with different step height, wherein the contact pad 208 is formed on the top surface of relative low region; wherein the adhesion layer 204a is formed on the top surface of relative high region such that the substrate 211 is adhered on (to) such top surface region of the substrate 209a. Moreover, a passivation layer 220 is formed on the chip 206 and the substrate 209a for fully-covering, partially-covering or non-covering over the wire 205, and filled into a gap between the chip 206 and the substrate 209a and exposing the sensing area 206a. Material of the passivation layer 220 is for example glue. Other configuration of the module structure of this embodiment is similar with that of the FIG. 4, and therefore the detailed description is omitted.

Figure 7:
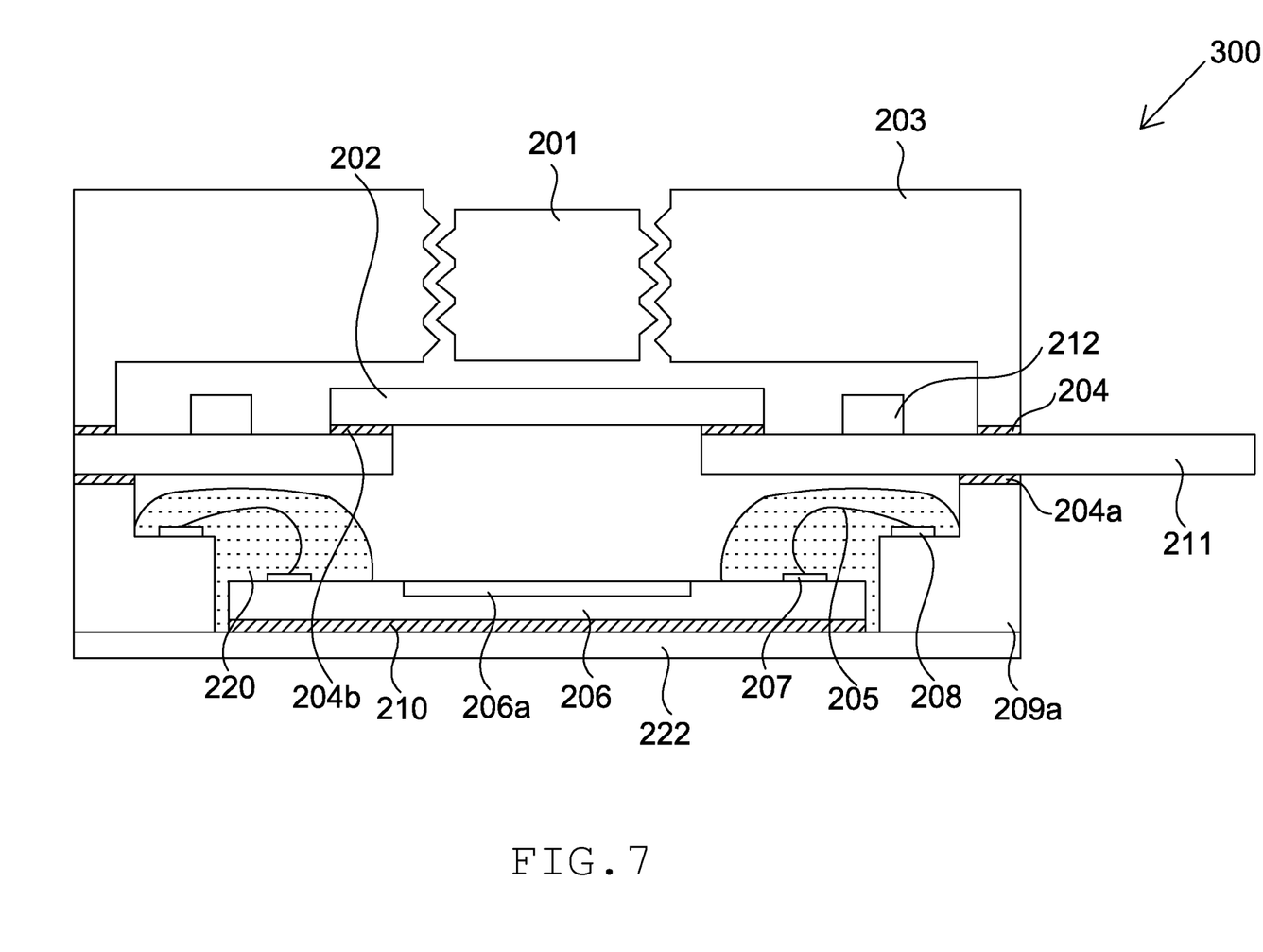
FIG. 7 illustrates a sectional view of a substrate inside type module structure according to an embodiment of the present invention.

As shown in FIG. 7, it shows a sectional view of a substrate inside type module structure according to an embodiment of the present invention. In the module structure 300 of this embodiment, it further comprises an adhesion layer 222 formed under the substrate 209a, the chip 206 (the adhesion layer 210) and the passivation layer 220, and a material layer 230 formed on the adhesion layer 222. Material of the material layer 230 is for example a heat dissipation material, a non-transparent material or an anti-EMI (electromagnetic interference) material, and the combination thereof.

Figure 8:
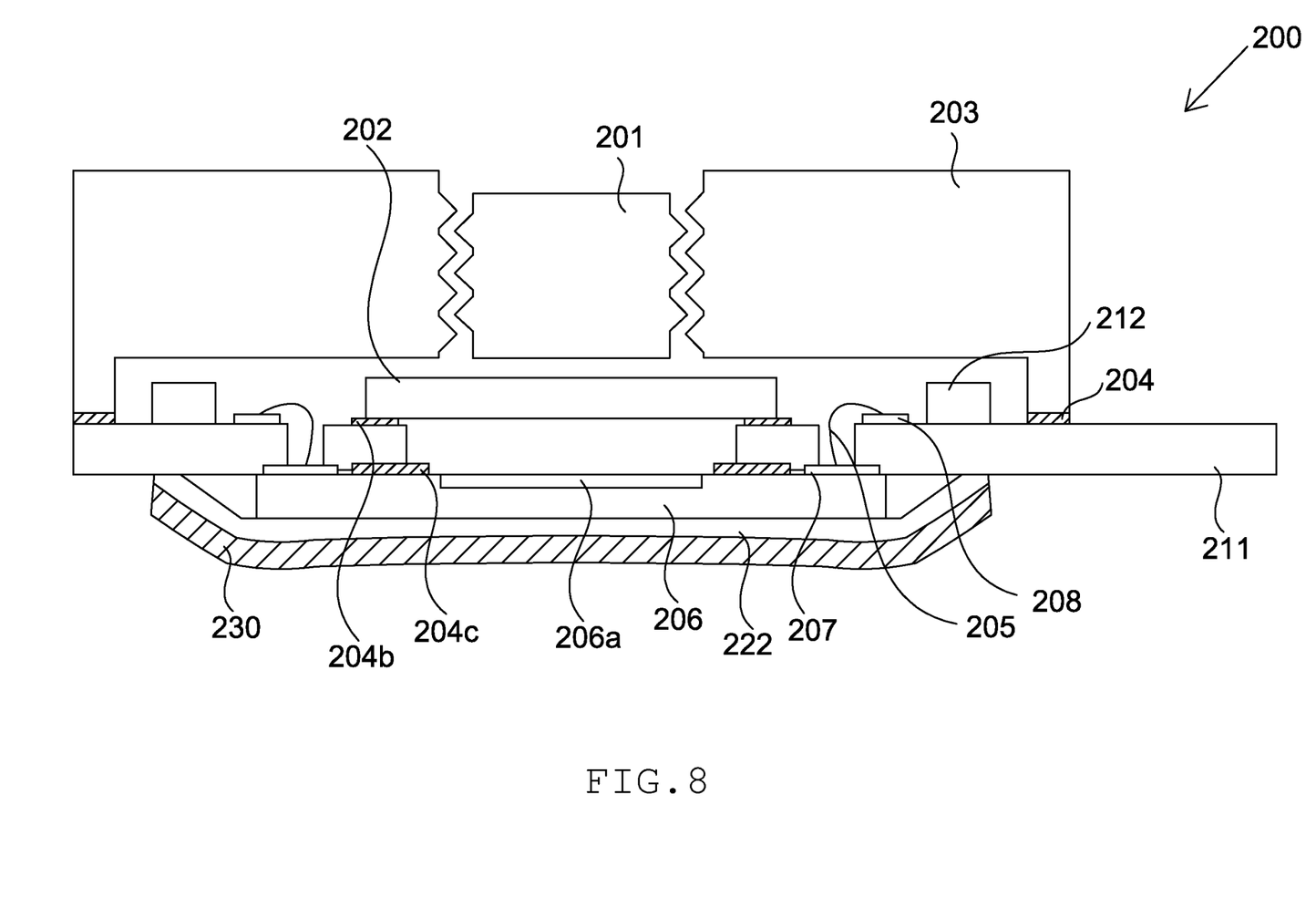
FIG. 8 illustrates a sectional view of a substrate inside type module structure according to another embodiment of the present invention.

As shown in FIG. 8, it shows a sectional view of a substrate inside type module structure according to yet another embodiment of the present invention. In this embodiment, the module structure 200 is based-on the module structure of the FIG. 5. It only uses a substrate 211, without the substrate 209. The substrate 211 may extend to outside of the module structure, electrical signals of the module structure can be transmitted to other components outside of the module structure via the trace of the substrate 211. An adhesion layer 222 is formed on the backside of the chip 206 and the lower surface of the substrate 211. A material layer 230 formed on the adhesion layer 222. Material of the material layer 230 is for example a heat dissipation material, a non-transparent material or anti-EMI (electromagnetic interference) material, and the combination thereof.

Figure 9:
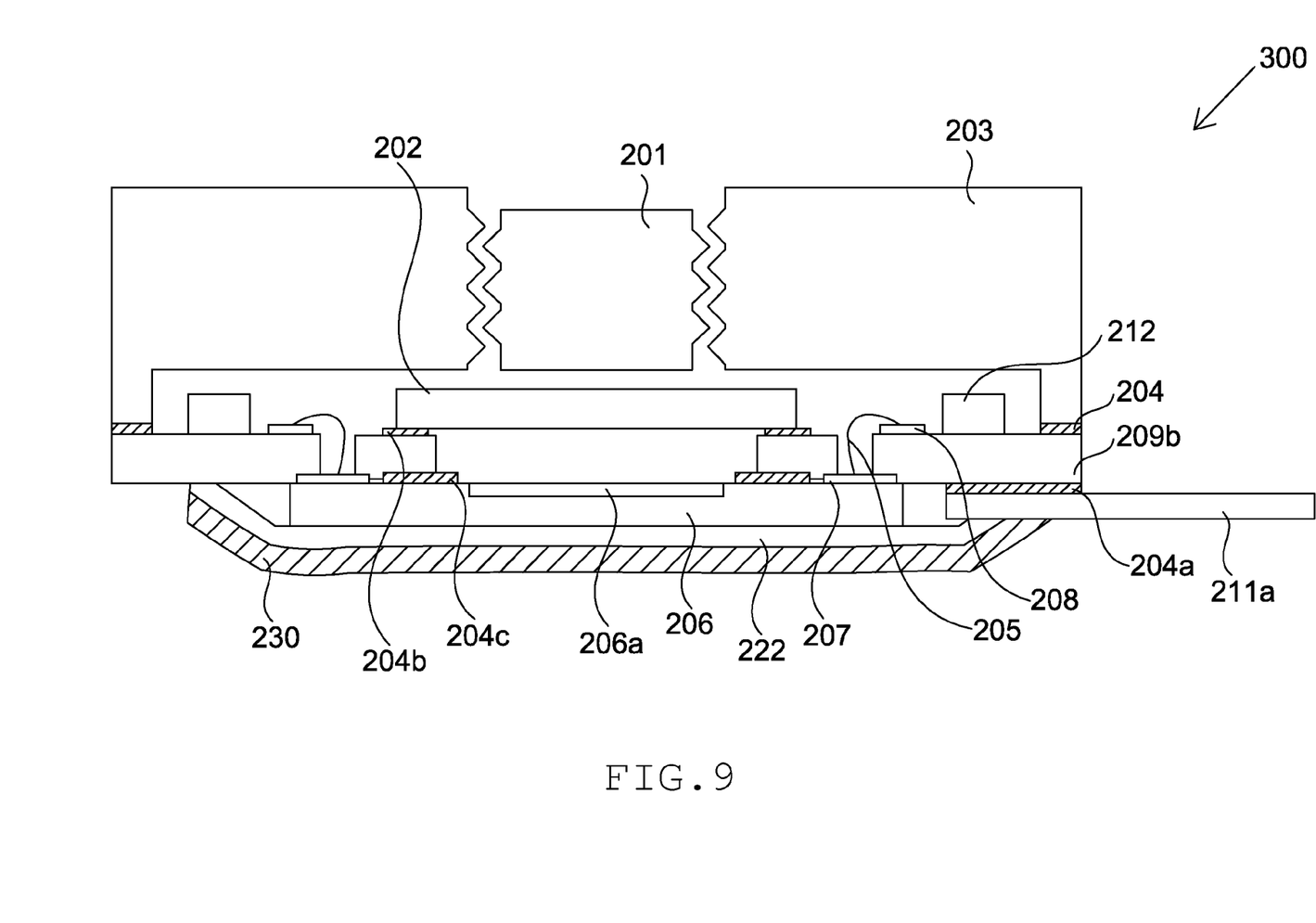
FIG. 9 illustrates a sectional view of a substrate inside type module structure according to yet another embodiment of the present invention.

As shown in FIG. 9, it shows a sectional view of a substrate inside type module structure according to yet another embodiment of the present invention. In this embodiment, the module structure 200 is based-on the module structure of the FIG. 8. The substrate of the module structure is constructed by a substrate 209b connected to a substrate 211a via an adhesion layer 204a. The substrate 211a has a portion extendable to outside of the module structure. In an example, only the attached region between the substrate 211a and the substrate 209b is overlapped with each other, the other region between two substrates is non-overlapped or non-connected. There is no overlapping between the substrate 211a and the chip 206. An adhesion layer 222 is formed on the backside of the chip 206 and the lower surface of the substrate 211a. A material layer 230 formed on the adhesion layer 222. Similarly, material of the material layer 230 is for example a heat dissipation material, a non-transparent material or anti-EMI (electromagnetic interference) material, and the combination thereof.

In one embodiment of the present invention, the substrate 209 (209a) is a printed circuit board. Besides, the substrate 209 may be an organic substrate with a predetermined through hole, and which material includes, for example epoxy type FR5 or FR4, or BT (Bismaleimide Triazine). Moreover, glass, ceramic and silicon may be as material of the substrate 209 (209a).

The advantages of the present invention comprises smaller height of the module structure, using current wire bonding process (electrical connect method) which is easy and cheap, good thermal performance and easy to manufacture multiple chip packaging.

The foregoing descriptions are preferred embodiments of the present invention. As is understood by a person skilled in the art, the aforementioned preferred embodiments of the present invention are illustrative of the present invention rather than limiting the present invention. The present invention is intended to cover various modifications and similar arrangements included within the spirit and scope of the appended claims, the scope of which should be accorded the broadest interpretation so as to encompass all such modifications and similar structures.

What is claimed is:

1. A substrate inside type module structure, comprising:
   a first substrate, with a concave structure, wherein said concave structure is a partial structure of said first substrate having a bottom surface and a top surface, wherein said bottom surface has a thickness difference with said top surface;
   a chip configured on said bottom surface within said concave structure, with a first contact pad and a sensing area;
   a second substrate disposed on said first substrate, with at least one through hole structure, wherein said second substrate includes a first portion embedded into said module structure and a second portion extending to outside of said module structure, wherein said at least one through hole structure is formed in said first portion of said second substrate without filling electrical material and having an area for exposing said sensing area;
   a second contact pad, formed on said first substrate or said second substrate, wherein said first contact pad of said chip is electrically connected to said second contact pad of said first substrate or said second substrate via a wire without bump; and
   a lens holder disposed on said second substrate, and a lens located on said lens holder, substantially aligning to said sensing area.

2. The module structure of claim 1, wherein said first substrate is adhered to said second substrate via a conductive layer or an adhesion layer.

3. The module structure of claim 1, wherein said chip is adhered to said first substrate via an adhesion layer.

4. The module structure of claim 1, wherein said lens holder is adhered to said second substrate via an adhesion layer.

5. The module structure of claim 1, further comprising a transparent material configured within said lens holder or on said second substrate.

* * * * *